(12) United States Patent
Thies et al.

(10) Patent No.: US 6,736,983 B1
(45) Date of Patent: May 18, 2004

(54) METHOD FOR PRODUCING MICROCOMPONENTS

(75) Inventors: Andreas Thies, Wohnsitz (DE); Konrad Cramer, Wohnsitz (DE); Heinrich Meyer, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/979,318

(22) PCT Filed: May 23, 2000

(86) PCT No.: PCT/DE00/01676
§ 371 (c)(1),
(2), (4) Date: Feb. 4, 2002

(87) PCT Pub. No.: WO00/73056
PCT Pub. Date: Dec. 7, 2000

(30) Foreign Application Priority Data

May 28, 1999 (DE) .......................... 199 26 025

(51) Int. Cl.⁷ .................................. C23F 1/00
(52) U.S. Cl. ................ 216/2; 216/33; 216/41; 165/804; 438/455; 438/456
(58) Field of Search ........................ 216/2, 33, 41; 165/804, 80.4; 438/455, 456

(56) References Cited

U.S. PATENT DOCUMENTS

| | | | | |
|---|---|---|---|---|
| 3,853,714 A | * | 12/1974 | Shimada et al. ............. | 205/73 |
| 3,894,965 A | * | 7/1975 | Foster et al. ................. | 502/261 |
| 4,078,604 A | * | 3/1978 | Christl et al. ................ | 165/133 |
| 5,152,060 A | * | 10/1992 | Schubert et al. ........ | 29/890.039 |
| 5,192,623 A | | 3/1993 | Gewelber ..................... | 428/593 |
| 5,512,250 A | * | 4/1996 | Betta et al. .................. | 422/173 |
| 5,534,328 A | | 7/1996 | Ashmead et al. ............ | 428/166 |
| 5,727,618 A | * | 3/1998 | Mundinger et al. ......... | 165/80.4 |
| 5,798,042 A | | 8/1998 | Chu et al. .................... | 210/490 |
| 2002/0119079 A1 | * | 8/2002 | Breuer et al. ............... | 422/128 |

FOREIGN PATENT DOCUMENTS

| | | |
|---|---|---|
| DE | WO 92/15408 A | 9/1992 |
| DE | 19708472 A1 | 9/1998 |
| EP | 0212878 A1 | 4/1987 |
| JP | 2-205081 A * | 8/1990 ........... H01L/35/32 |
| JP | 0020209756 AA | 8/1990 |

OTHER PUBLICATIONS

"Wafer–to–Wafer Bonding for Microstructure Formation" Article, from Proceedings of the IEEE, vol. 86, No. 8, Aug. 1998.

(List continued on next page.)

*Primary Examiner*—Robert Kunemund
*Assistant Examiner*—Shamim Ahmed
(74) *Attorney, Agent, or Firm*—Frank J. Bonini, Jr.; John F. A. Earley, III; Harding, Earley, Follmer & Frailey (57) ABSTRACT

Micro-components having at least one individual layer are produced according to the method, which have functional layers 3 on the walls of inner structures, for example of flow channels. The micro-components are intended to be suitable for a large number of different applications in chemical reaction technology, for heat exchanging, for mixing substances or for evaporating liquids. In particular, the micro-components are intended to have no problems in respect of leaks in the flow channels. The method has the following method steps: A. producing the at least one individual layer by: a. producing a first metal layer or a metal foil 1; b. forming the inner structures in and/or on the first metal layer or metal foil 1 by suitable etching methods and/or metal deposition methods; and c. forming the functional layers 3 solely on the walls of the inner structures and thereafter B. stacking up and joining the one individual layer to a segment terminating the inner structures, or a plurality of individual layers to one another and to the terminating segment.

15 Claims, 4 Drawing Sheets

OTHER PUBLICATIONS

"Scouting Study About The Use Of Microreactors for Gas Supply in a PEM–Fuel Cell System for Traction," by R. Peters, et al., Proc. of the 1st International Conf. on Microreaction Technology, Frankfurt, 1997.

Deep X–Ray Lithography For The Production Of Three–Dimensional Microstructures From Metals, Polymers and Ceramics, by W. Ehrfeld and H. Lehr in Radiat. Phys. Chem., vol. 45, pp. 349 to 365, (description of a LIGA–process), (1995).

"Microfabricated Minichemical Systems: Technical Feasibility," by J.J. Lerou, et al., DECHEMA Monographs, vol. 132, pp. 51–69, (1996).

International Search Report in PCT/DE00/01676 dated Nov. 10, 2000.

\* cited by examiner

METHOD FOR PRODUCING MICROCOMPONENTS

The invention relates to a method of manufacturing micro-components having at least one individual layer, which can be used in the chemical industry inter alia for synthesis reactions and in other fields, for example as reactors for generating hydrogen for energy conversion (fuel cells), as well as heat exchangers, mixers and evaporators.

In the literature, there have been reports for some years now of chemical microreactors which have advantages in comparison with the traditional production plants for manufacturing chemical compounds. Here it is a question of an arrangement of reaction cells, the dimensions of which range between a few micrometers and several millimeters, and thus are very much smaller than the traditional reactors. These reaction cells are so designed that in them physical, chemical or electrochemical reactions can take place. In contrast to a traditional porous system (heterogeneous catalysis), the dimensions of these cells are defined by their construction, therefore may be manufactured systematically by means of a technical method. The arrangement of individual reaction cells in the assembly of the reactor is ordered, particularly periodically in one, two or three dimensions. Amongst the chemical microreactors are counted, in a wider sense, also the necessary supply and discharge structures for the fluids (liquids, gases) and sensors and actuators, for example valves which control the flow of substance through the individual cells, and heating elements.

The use of chemical microreactors for generating hydrogen for fuel cells for the conversion of energy has been described for example by R. Peters et al. in "Scouting Study about the Use of Microreactors for Gas Supply in a PEM-Fuel Cell System for Traction", Proc. of the $1^{st}$ Int. Conf. on Microreaction Technology, Frankfurt, 1997.

This concept for chemical microreactors has also been applied to heat exchangers. In this case, at least two fluid channels separate from one another are present in the heat exchanger and serve to transfer heat from fluid in the one channel to fluid in the other channel.

There is a series of proposals for the manufacture of chemical microreactors or heat exchangers:

For example the LIGA-process (lithography, electroforming, moulding) is used. In this process a plastics material layer, mostly polymethyl methacrylate (PMMA) is exposed to synchrotron radiation and then developed. The structure produced in this way is filled with metal by means of an electrolytic process. The metal structure can then be multiplied in further method steps by means of plastics moulding (plastics injection moulding). This method was described by W. Ehrfeld and H. Lehr in Radiat. Phys. Chem., Vol. 45, pages 349 to 365.

The methods which have been developed in the semiconductor industry for structuring silicon surfaces have also been adopted for manufacturing of microreactors. For instance in "Microfabricated. Minichemical Systems: Technical Feasibility", DECHEMA Monographs, Volume 132, pages 51 to 69 a method is described by J. J. Lerou et al. in which three etched silicon wafers and two end wafers are connected to one another on the outer sides. Furthermore, a heat exchanger filled with polycrystalline silver particles is used which was also configured as a microreactor.

In the same way, the method of manufacturing microreactors which is described in U.S. Pat. No. 5,534,328 also proceeds from etched silicone wafers which are joined into a stack. However, other materials are also mentioned for the microreactors, for example metals, polymers, ceramics, glass and composite materials. To carry out catalytic reactions it is proposed inter alia that the walls of the reaction channels in the reactors be coated with a catalytic layer.

In EP 0 212 878 A1, a method of manufacturing a heat exchanger is described in which the flow channels of the heat medium are formed in steel plates by chemical etching. The steel plates are then welded to one another by diffusion bonding.

In WO-A-9215408, a method of manufacturing microstrainers is described in which perforations are etched in a certain pattern through plasma technology into a flat carrier coated with an etch-resistant layer. Several of these perforated carriers are then connected to one another.

In DE 197 08 472 A1, a method of manufacturing chemical microreactors is described in which fluid channels are formed in individual planes, by substrates provided with metal surfaces being structured by means of photolithographic techniques or screen printing methods, and the channel structures obtained being formed by methods of removing or depositing metal. The individually produced planes are then combined to form a stack and securely connected to one another. For example, the channels can be produced by partial etching away of the metal layer on the substrate.

The previously known methods for manufacturing chemical microreactors and heat exchangers have manifold disadvantages. For example complicated and/or expensive techniques are necessary for producing the channels. In some cases, the manufacture of reactors is limited exclusively to silicone as a material.

It is frequently also necessary to produce a functional coating on the channel walls to set pre-determined properties of the micro-components. Thus for example a microreactor can be produced from a heat exchanger manufactured from copper, by the channels being coated with a metal layer deposited in an electroless manner, for example with palladium. In chemical reaction technology, the functional surface layers serve for example the catalysis of chemical reactions. Subsequent coating of the flow channels in the planes by means of a galvano-technical method is however frequently not possible since the functional layers in this case cannot be applied electrolytically on account of the electrical shielding by the reactor or heat exchanger itself. In electroless metallisation, also, it has emerged that secure coating is not possible since the metallisation baths usually used react very sensitively to different flow speeds of the metallisation fluid on the surfaces to be coated. Under these conditions, inter alia those surface regions past which the metallisation fluid flows slowly are metallised in an electroless manner whilst surface regions past which the fluid flows at a high speed are not coated with metal. With very narrow channels, problems can occur in electroless metal deposition which is based on the very high bath load (surface to be coated per bath volume), such that only inadequate layer qualities are produced. Possibly a layer formation with total covering of the surface becomes completely impossible. Moreover by means of electroless methods only certain metals can be deposited.

Gas deposition methods for applying layers are in this case practically unusable.

In the cases in which the functional layers are applied before the individual layers are joined to form the micro-component, the connection of the individual component layers has proved to be problematic since no reliable connection can be produced between the individual layers. Frequently the components produced from the individual layers have leaks from which fluid which is under relatively high pressure penetrates outwards from the channels.

Furthermore the functional layers are not stable in relation to the joining temperatures usually used to join together the individual layers. The functional layers, particularly in cases in which the material has a lower melting or transition temperature than the temperature during joining, are damaged or even destroyed. In particular also noble metals such as platinum, iridium, palladium and gold can be applied to form the functional layers. These metals admittedly have a higher melting point than the copper usually used as a basic material for the micro-component and should therefore be thermally resistant in a joining process in which the basic materials of two individual layers are welded to one another. However, in this and other similarly layered cases, it has been noticed that for example in diffusion bonding microstructured reactor foils coated in this way, such high bonding temperatures are necessary that the functional layer and the basic material become mixed with one another even before there is sufficient connection of the basic materials to one another. Thus the functionality of the layer is destroyed, for example a palladium layer on an individual layer consisting of copper, since palladium diffuses very quickly into the copper under these conditions.

For these reasons, manufacturing methods in which the functional layers are applied before the individual layers are joined together, have not been considered practicable.

The problem underlying the present invention, therefore, is to manufacture micro-components having at least one individual layer, which have inner structures delimited by walls, for example flow channels, in the components and functional layers on the walls of the structures. The micro-components should be suitable for a large number of different applications in chemical reaction technology, for heat exchanging, for mixing substances or for evaporating liquids. In particular it should be possible to apply different coatings to the channel surfaces for different applications of the micro-component. Furthermore, the method of manufacturing should be able to be carried out as quickly and as cheaply as possible without high failure rates occurring in the production of the micro-components. Microreactors, heat exchangers, mixers and evaporators of this kind should also be able to be manufactured in large numbers simply and cheaply. In particular it should be possible to produce micro-components which have no problems in respect of leaks from the flow channels, and in which no problems occur in respect of the stability of the functional layers when the individual layers are joined.

This problem is solved by the method according to Claim 1. Preferred embodiments of the invention are quoted in the subordinate claims.

In particular the problem that the known manufacturing methods do not succeed in producing microreactors and other micro-components which are completely free of leaks at the joining points, can be solved by the method according to the invention. Only by extensive experiments was it possible to explain the cause of the leaks by the fact that the functional layers frequently exercise a harmful influence on the cohesion of the layers to one another. A solution to this problem has proved to be the functional layers being formed exclusively on the walls of the channels before the individual layers are stacked up and joined to one another and to a segment terminating the flow channels. What is namely thereby avoided is that functional layers are also formed at the locations on the micro-structured layers which are necessary for joining the layers together.

The method according to the invention also offers the advantage that the joining process can be carried out at a low temperature. By this means, micro-components with temperature-sensitive functional layers can also be produced without these layers being impaired. Since under these conditions, a diffusion of the functional layers into the basic material of the first metal layer or metal foil can be largely prevented, thermally sensitive functional layers can also be used.

Through the method, also, the problems do not appear which occur if the functional layers are only applied after the individual layers have been joined together to form the micro-component. In particular, gas deposition methods can also be used without problem to apply layers, for example to form layers which cannot be produced with an electroless metal deposition method. Furthermore, electroless or electrolytic metallisation is also readily successful.

The method according to the invention serving to manufacture the micro-components consists of the following sequence of method steps:

A. producing an individual layer by
  a. producing a first metal layer or a metal foil;
  b. forming the inner structures in and/or on the first metal layer or metal foil, for example the flow channels, by suitable etching methods and/or metal deposition methods;
  c. forming the functional layers solely on the walls of the inner structure;
B. thereafter stacking and joining the individual layer to a segment terminating the flow channels or a plurality of individual layers to one another and to the terminating segment.

The flow channels in and/or on the first metal layer or metal foil are formed in one embodiment of the invention preferably by the following method steps:

b. copying the flow channels on the first metal layer or metal foil by a structuring method; and b'. selective etching of the regions of the first metal layer or metal foil which are exposed during structuring.

As copying methods, the following method alternatives can be used:

b1. coating at least one surface of the first metal layer or metal foil with a photosensitive layer, for example a photoresist usually used in printed circuit board technology or semi-conductor technology, exposing the photosensitive layer with the pattern of the flow channels and exposing the first metal layer or metal foil at all the locations which correspond to the channels to be formed;

b2. coating at least one surface of the first metal layer or metal foil with a screen-printing. lacquer layer at the locations on the surface which do not correspond to the channels to be formed;

b3. laminating a perforated foil, for example a plastics film, onto at least one surface of the first metal layer or metal foil, the perforations being provided at all the locations of the surface which correspond to the channels to be formed.

In principle a metal resist can also be used, i.e. a second metal layer which is applied to the first metal layer or the metal foil, and which is structured by means of one of the methods described above. To this end, one of the previously mentioned covering layers or respectively the perforated foil is applied to the metal resist layer, structured itself and perforations are introduced in the metal resist layer at the locations at which the metal resist layer is exposed. Thereafter, the covering layer or the perforated foil is removed again before further processing.

The photosensitive layer, the screen-printing lacquer layer or the perforated foil can be removed again between the method steps c (forming the functional layers solely on the walls of the flow channels) and B (stacking and joining together the individual layers and the terminating segment) or after method step B. In a further embodiment of the invention, additional metal layers can also be applied, before the individual layers are joined together, solely on the surface regions of the first metal layer or metal foil which are not coated with the functional layers, by the following method steps being carried out:

- d. coating solely the functional layers by a protective film which is soluble in a different solvent from the photosensitive layer, the screen-printing lacquer layer or the perforated foil;
- e. forming additional metal layers after removing the photosensitive layer, the screen-printing lacquer layer or the perforated foil on the bare surface regions of the first metal layer or metal foil; and
- f. removing the protective film.

With this method variant, for example metal layers can be applied to the surface regions of the first metal layer or metal foil, which serve as solder layers when the-individual layers are joined together. For example a tin/lead or a tin/bismuth alloy layer can be deposited.

In a further variant of the last mentioned method, instead of the additional metal layer also an adhesive layer can be applied solely to the surface regions of the first metal layer or metal foil which are not coated with the functional layers, by

- d. only the functional layers being covered by a protective film;
- e. the adhesive layers being formed after removing the photosensitive layer, the screen-printing lacquer layer or the perforated foil on the bare surface regions of the first metal layer or metal foil; and
- f. the protective film being removed again.

Adhesive layers serve just like the previously mentioned solder layers to join together the individual layers, the adhesive layers being used in particular if particularly temperature-sensitive functional layers are formed in the flow channels, such that an increased temperature may not be set during the joining process.

In a further advantageous embodiment of the invention, the flow channels, provided with functional layers, are formed in the first metal layer or metal foil by the following sequence of method steps:

- c. forming a functional layer on the first metal layer or metal foil;
- b. copying the flow channels by one of the following method alternatives:
  - b1. coating at least one surface of the functional layer with a photosensitive layer, exposing the photosensitive layer with the pattern of the flow channels and exposing the first metal layer or metal foil, coated with the functional layer, at all the locations which correspond to the channels to be formed; or
  - b2. coating at least one surface of the functional layer with a screen-printing lacquer layer at the locations on the surface which do not correspond to the channels to be formed; or
  - b3. laminating a perforated foil onto at least one surface of the functional layer, the perforations being provided at all the locations of the surface which correspond to the channels to be formed; and
- b'. forming depressions in the functional layer and possibly in the first metal layer or metal foil by selective etching of the bare regions of the functional layer and possibly of the first metal layer or metal foil;
- b". forming metal webs exclusively in the depressions formed in method step b'.

In the case where the photosensitive layer, the screen-printing lacquer layer or the perforated foil protrudes beyond the metal webs formed in the depressions, by grinding and/or polishing a substantially flat surface can be produced formed by the metal webs and the photosensitive layer, the screen-printing lacquer layer or the perforated foil. In this case too, the photosensitive layer, the screen-printing lacquer layer or the perforated foil is removed again before the individual layers are joined together. The webs form the walls of the flow channels.

After the individual layers have been produced by one of the method alternatives described above, the microcomponent is produced by stacking and joining the individual layers to one another and to the terminating segment. For this purpose, according to the technology used, a soldering or welding method, for example a diffusion bonding method, or a gluing method can be used.

The first metal layer or metal foil consists preferably of copper, steel or aluminium.

For a further explanation of the method, reference is made to FIGS. 1 to 4. These show.

Figure 1:
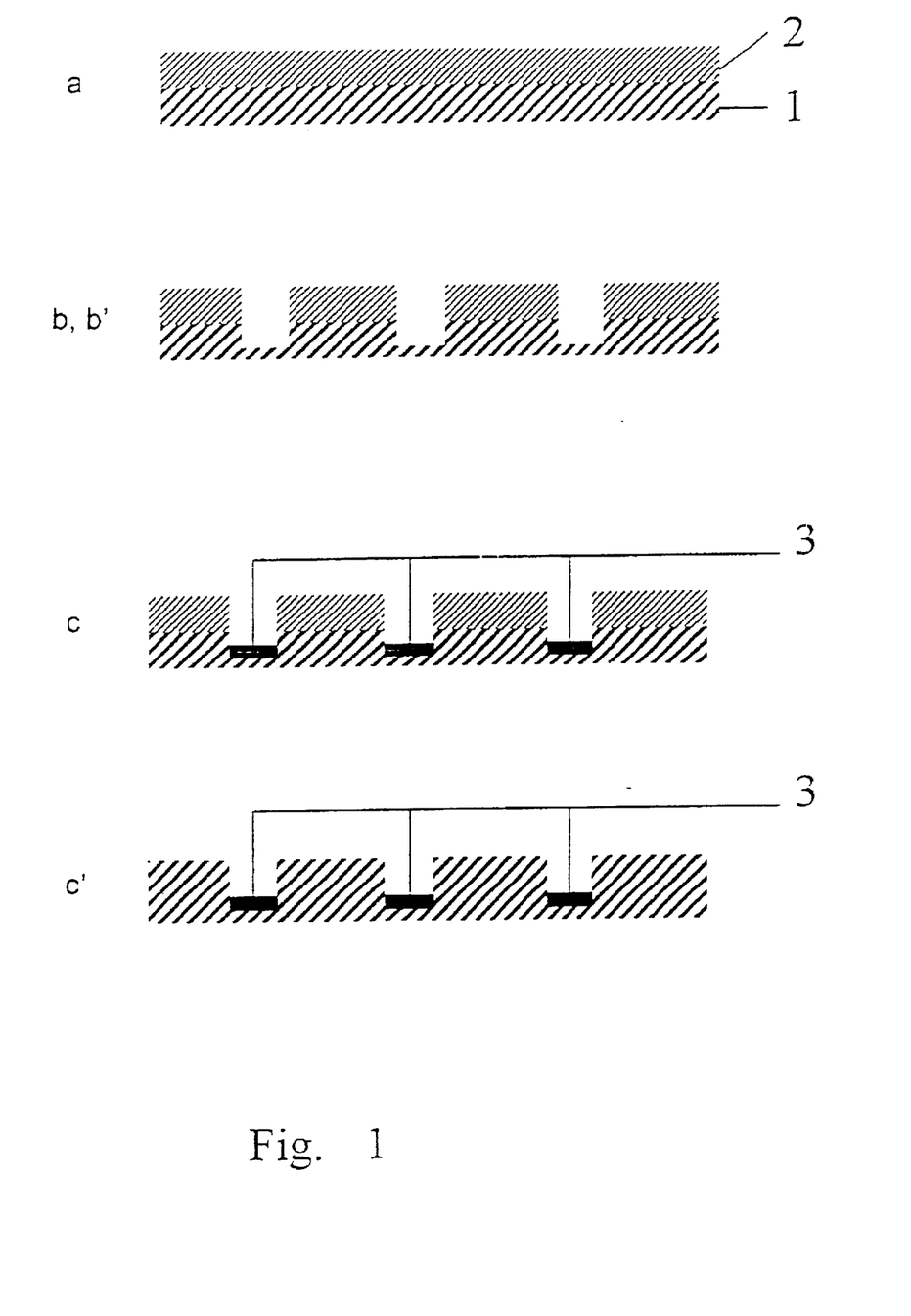
FIG. 1: a schematic representation of the method sequence in a first method variant A.

In FIG. 1 is represented the method sequence for manufacturing an individual layer in the basic form of the method (variant A) is represented. According to method step a, first of all a metal foil 1 is produced, for example from copper. The foil can also in principle consist of any other material, for example steel or aluminium.

The copper foil 1 can be produced for example by an electrolytic copper deposition method. Methods of this type are used in the manufacture of copper foils for use in printed circuit board technology and are therefore known. The metal foil can have a thickness of between 1 and 500 $\mu$m. Generally these foils have a thickness of roughly 18 $\mu$m.

Instead of a metal foil 1 to produce the individual layer, a first metal layer can be used on a carrier.

A photosensitive layer 2, for example a photosensitive coating working negatively (or a screen-printing lacquer layer or a perforated foil) can be applied over the entire surface of the metal foil 1. In principle, a metal resist layer can also be deposited from a metal which is not attacked in the following etching of the metal foil. To structure the metal resist layer, one of the structuring methods are used utilising photosensitive or screen-printing lacquer layers or a perforated foil.

Then the photosensitive coating 2 is exposed according to method step b with the pattern of the flow channels to be formed, at the locations at which the flow channels are not to be formed in the metal foil 1. In the subsequent development step, all the non-exposed regions of the photosensitive coating (or screen-printing lacquer layer or perforated foil), in which the flow channels are to be formed, are then removed.

Thereafter, in method step b', the metal foil 1 is etched at the exposed locations with a suitable etching medium, for example a $CuCl_2$ or an $FeCl_3$ solution, such that depressions are formed in these regions which correspond to the flow channels to be formed.

Then the desired functional layer 3 is deposited according to method step c on the walls and the base of the depressions formed in the metal foil 1. The type of deposition method depends on the type of material of the functional layer. For example noble metal layers can easily be formed with an electrolytic metal deposition method. Alternatively, an electroless metallisation method or a method of metal deposition from the gas phase can be used, for example a PVD, CVD, PECVD, sputtering or vapour deposition method. Alternatively, a sol-gel method for forming silicate or other oxide layers can be used, or molecular layers which have specific catalytic properties can also be chemisorbed or absorbed, or also plastics material layers or ceramic layers can be formed. The ceramic layers are especially advantageous if a large surface is to be produced on the flow channel walls. For this purpose, porous ceramic layers, for example oxide layers, are formed by sputtering. What is also very suitable is a vapour-deposited aluminium layer, which can be subsequently transformed into an aluminium oxide layer by anodising or treating with nitric acid for example. A layer of this kind can serve as a carrier for catalysts with which this layer can be impregnated. The functional layer can for its part also be constructed of different layers. These layers can serve inter alia as carrier-fixed catalysts. Roughened flow channel walls, which can be formed for example by roughening of the metallic walls with a metal etching solution, can also be considered as functional layers in the sense of the invention.

The thickness of the functional layer 3 is, according to the application, preferably 10 nm to 100 $\mu$m. If catalytic layers are to be formed, even extremely thin layers are adequate for the desired purpose.

The functional layer 3 is preferably only formed on the bare copper surfaces. This can be guaranteed for example by using an electrolytic metal deposition method if the functional layer also extends onto the covering layer or the perforated foil 2, these are then removed again together with the covering layer or the perforated foil from the surface of the metal foil 1. By this means it is always guaranteed that in the regions on the surface of the metal foil adjacent to the flow channels, no functional layer is formed in the manner of the invention.

According to method step c', the photosensitive layer, the screen-printing lacquer layer, the perforated foil or the metal resist are then removed again, for example dissolved. If a photosensitive layer, a screen-printing lacquer layer or a perforated foil is used during the structuring method, these can be removed again by means of organic solvents or organic solvents mixed with water, or with an aqueous alkaline solution. The solvent preferably contains a wetting agent with a low surface tension. The choice of solvent depends on the type of plastics material to be dissolved (screen-printing lacquer, photosensitive layer, perforated foil). For polymethyl methacrylate as the plastics material, for example acetone, chloroform, butanone, 1.4-dioxane and N,N-dimethylformamide and mixtures of same, and for photoresists, N-methylpyrrolidone, trichloroethane, dimethyl sulphoxide and methylene chloride and mixtures of same are suitable. Moreover aqueous alkaline systems can be used with suitable co-solvents. If a metal resist layer is used for the selective etching of the flow channels, according to the type of metal resist, a suitable acid, usually an inorganic acid, or an acid mixture is used.

The individual layer manufactured in this manner for a micro-component, for example a microreactor, heat exchanger, mixer or evaporator, is configured as a self-supporting copper foil 1, which contains the pre-shaped flow channels as depressions, and in which solely the flow channel walls are coated at least partially with a suitable functional layer 3.

A plurality of these individual layers can then be connected to one another, for example by means of a diffusion bonding method. To this end the individual layers are stacked register-exact above one another and then welded to one another by setting a sufficiently high temperature. In principle other joining methods can also be used, for example a soldering method or a gluing method. The flow channels of the uppermost individual layer, which are not terminated by an individual layer lying above them, are closed by a terminating segment. For this purpose, for example an additional metal foil, which contains no flow channels, can be welded together with the pile of individual layers. Equally, a micro-component can also be produced in which merely one individual layer is connected to a terminating segment.

Figure 2:
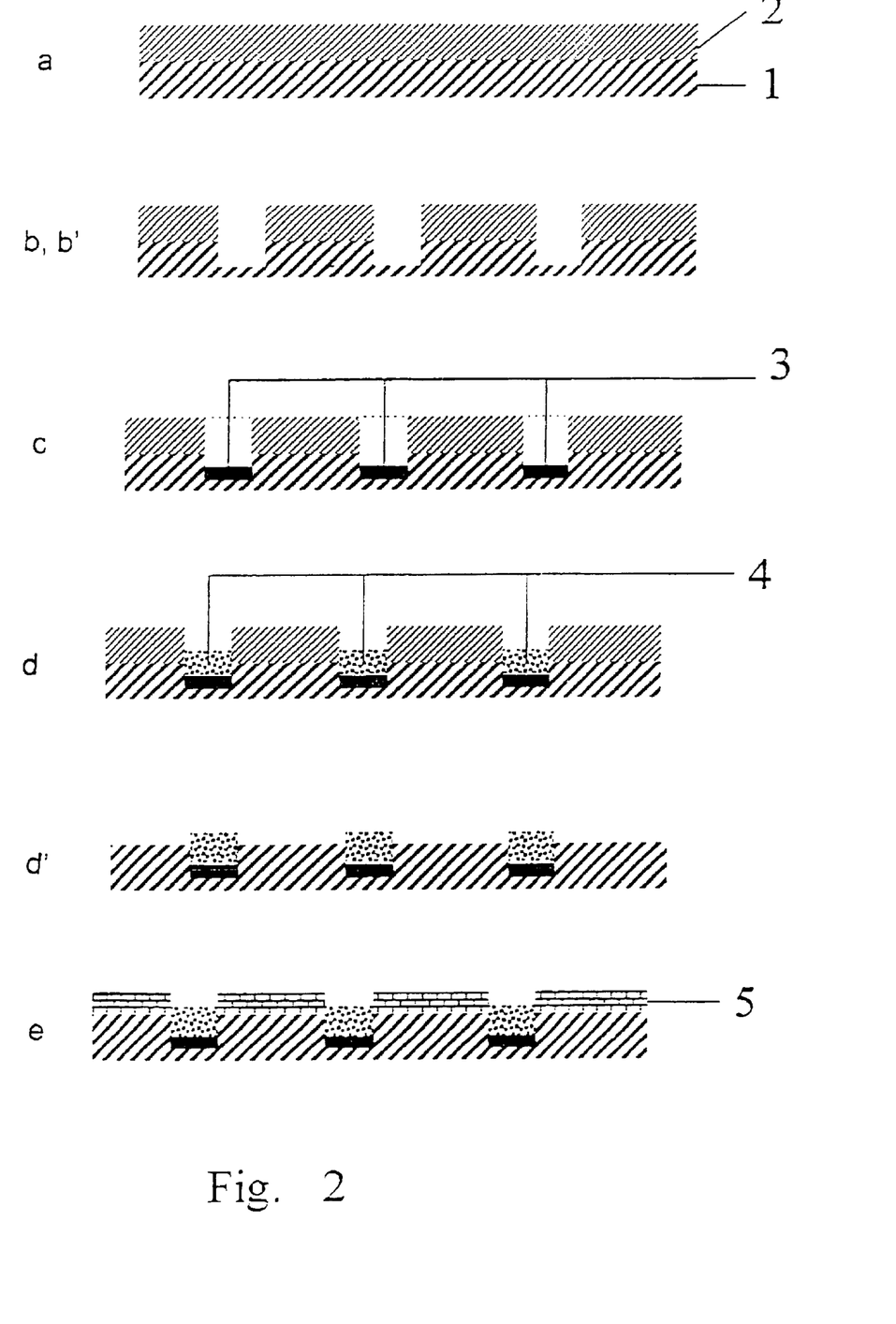
FIG. 2: a schematic representation of the method sequence in a second method variant B.

In FIG. 2 is represented a further method variant B:

The method steps a, b, b' and c are in this case identical with the corresponding steps in the preceding sequence. In order to apply an additional metal layer, for example a solder layer (for example of tin/lead or tin/bismuth alloy) solely on the locations on the metal foil 1 (or the first metal layer), which do not correspond to the flow channel regions, after the functional layer 3 has been formed, a further protective film 4 is formed solely on the functional layer in the flow channels (method step d). In selecting the material for this protective film, care must be taken to ensure that the covering layer 2 (photoresist, screen-printing lacquer layer, perforated foil or metal resist layer) and this protective film can only be removed in different solvents. For example the covering layer could consist of an alkali-soluble photoresist, which can be removed with an aqueous alkaline solution, and the protective film of an electrophoretic lacquer (formed for example from an anaphoretic or cataphoretic immersion lacquer) which can only be removed in an organic solvent.

Since the protective film 4 is to be applied solely on the functional layer 3, as a selectively depositing method or the protective film an electrophoretic method is suitable with which lacquers can be deposited solely on electrically conductive substrates, if the functional layer does not act as an electrical insulator and if simultaneously the covering layer 2 is electrically insulating.

Thereafter the covering layer, the perforated foil or the metal resist layer 2 is removed again (method step d'). The protective film regions 4 contained in the flow channels remain.

Thereafter, according to method step e, the additional metal layer 5, for example a solder layer, can be deposited in the bare regions of the metal foil 1. The same method alternatives can be used again as for the formation of the functional layer, i.e. a galvano-technical method or also a PVD, CVD, PECVD, sputtering or vapour deposition method. An electrolytic metal deposition method is particularly suitable since the additional metal layer can in this case be selectively deposited solely on the metal foil 1, but is not formed on the protective film 4.

Thereafter, the protective film 4 is removed again from the flow channel regions (method step f). A suitable solvent is used for this purpose.

Then a plurality of these individual layers can be connected to one another and in addition the uppermost individual layer can be provided with a terminating segment in order to produce the microreactor. When the individual layers are stacked up, the regions in which the additional metal is deposited, are brought into contact with the rear side of the respectively adjoining individual layer. If a low-melting material is selected for the additional metal, this can serve as a solder layer 5 to connect the individual layers reliably to one another.

In a further variant of this embodiment, there is also the possibility of not removing the protective film 4 again until after the stacking up and joining of the individual layers and the terminating segment. Since the protective film does not completely fill the channel cross-section, removal after assembling the component is not difficult. For this purpose, the assembled micro-component can be brought into contact for example with a solvent for the protective film under the simultaneous action of ultrasound and heat. Alternatively, the protective film can also be removed by pyrolysis. In this case, the formed micro-component structure is transferred into an oven and the Protective film is thermally decomposed. Possible residues of the decomposed organic material can then be removed in a solvent, again preferably under the action of ultrasound and in the presence of a suitable wetting agent. In a further alternative, the plastics material of the protective film can also be removed by means of a plasma process. To this end, the finished micro-component structure is brought into a glow discharge zone of a plasma reactor. In yet another alternative, the protective film can be removed with supercritical fluids. To this end, the micro-component structure is brought under suitable pressure and temperature conditions, for example in an autoclave, into contact with carbon dioxide, ethylene, propane, ammonia, dinitrogen dioxide, water, toluene, nitrogen heterocycles or other substances which are in a supercritical state. Very suitable are those supercritical fluids which can be transferred into the supercritical state close to room temperature. Carbon dioxide is a very suitable supercritical fluid. However this method can only be used if the protective film withstands the conditions during the joining of the individual layers. On the other hand this method of proceeding offers the advantage that the solder layer 5 cannot damage the functional layer 3 under these conditions, since during the joining process it is protected by the protective film.

The method variant as per FIG. 2 offers the advantage that the functional layer 3 and a joining layer (solder layer) 5 can be combined with one another without being mutually harmful.

Figure 3:
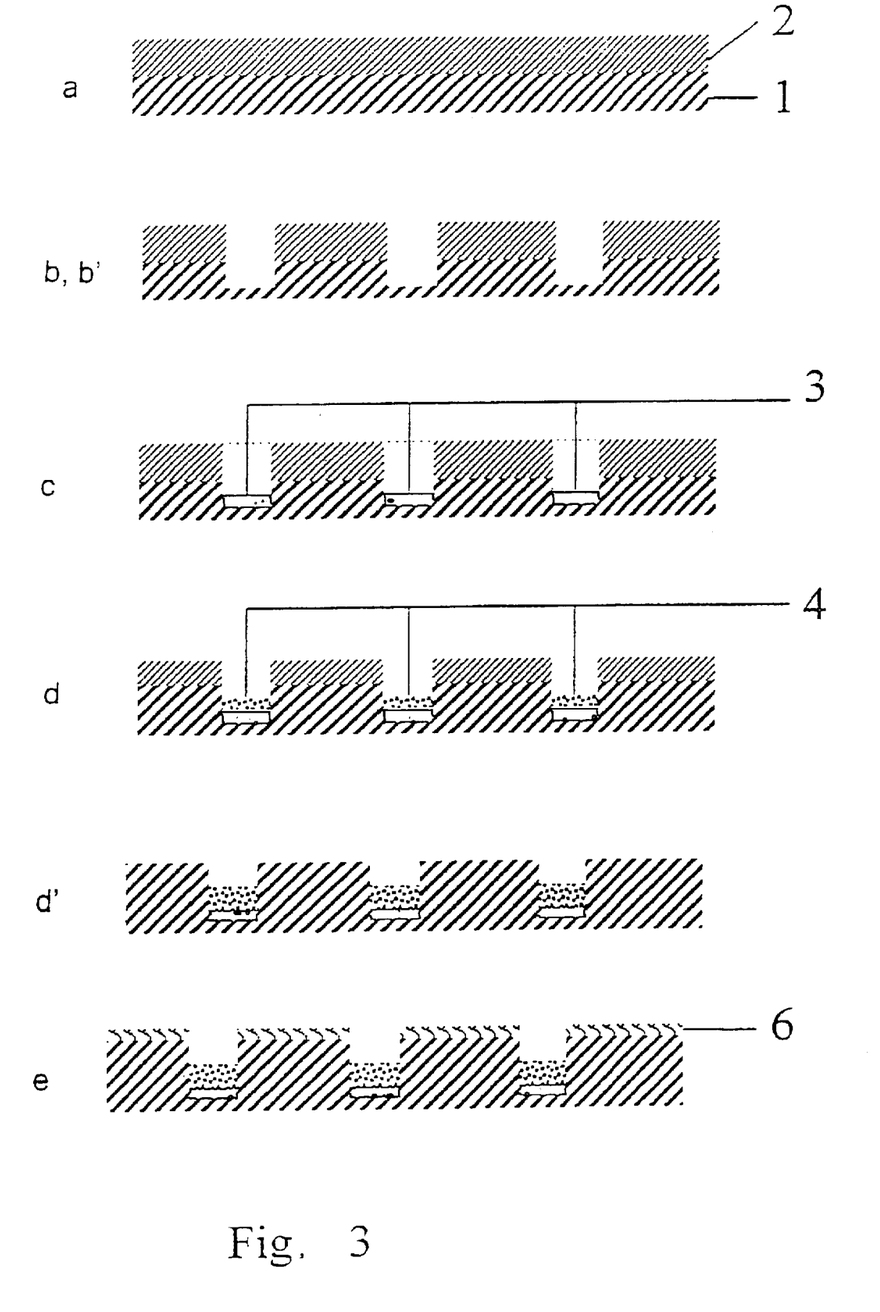
FIG. 3: a schematic representation of the method sequence in a third method variant C.

In FIG. 3 is represented the method sequence for a further method variant C. The method sequence differs from the previously described sequence as per FIG. 2 only in that, instead of the additional metal layer 5, an adhesive layer 6 is applied to the first metal layer or metal foil 1. A standard material can be used for the adhesive layer, for example a two-component adhesive.

In this case too, the protective film 4 can alternatively also be removed after the individual layers and the terminating segment have been joined together. In this case, any adhesive residue 6 which has reached the flow channels can be removed at the same time as the protective layer.

This method alternative is used if thermally extremely sensitive functional layers 3 are applied to the walls of the flow channels. It is also advantageous that the formed micro-components are well sealed against escaping fluid.

Figure 4:
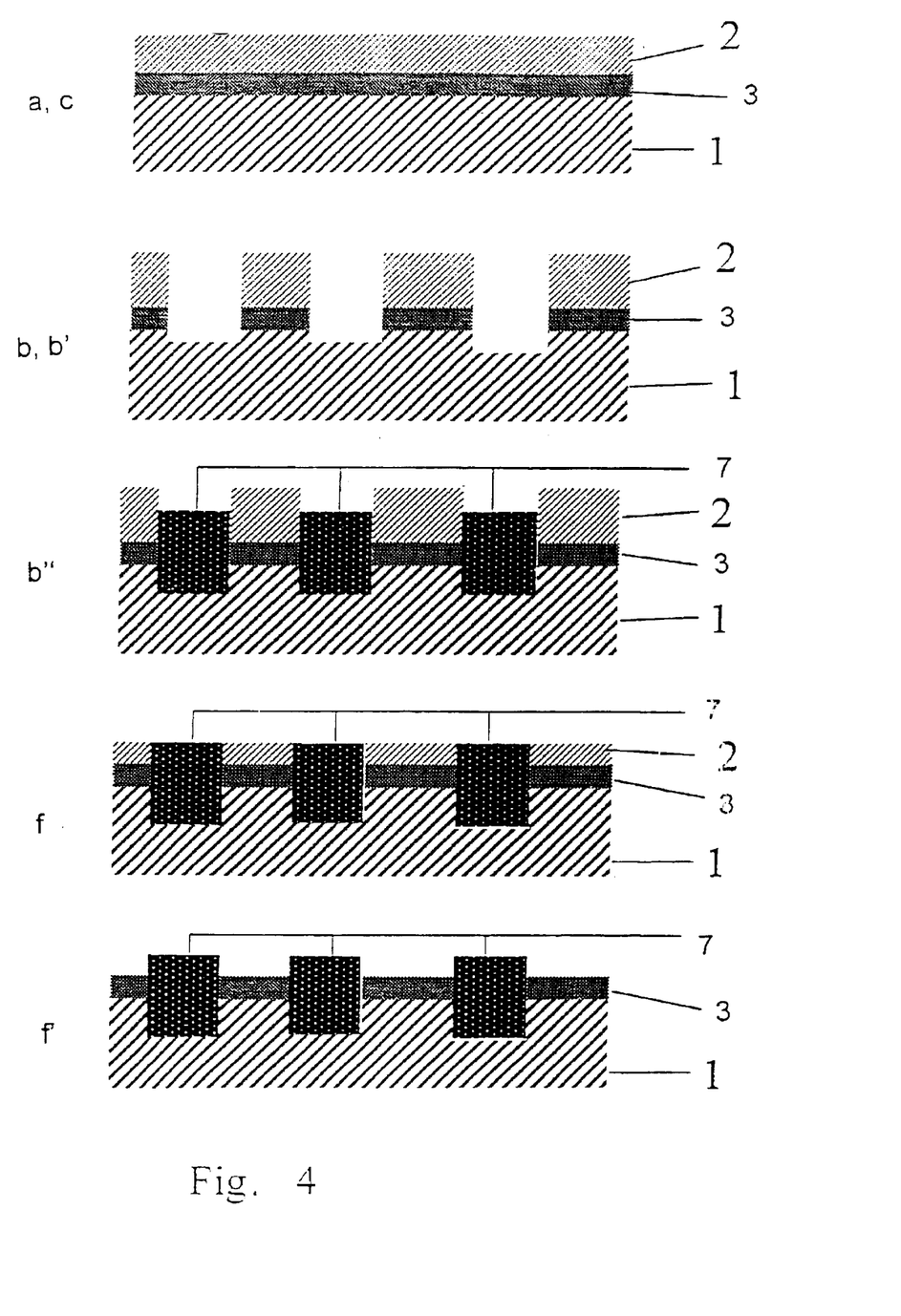
FIG. 4: a schematic representation of the method sequence in a fourth method variant D.

A further method variant D is represented in FIG. 4. In this case, a functional layer 3 is applied to the whole area of the first copper layer or copper foil 1. For the type of material for the functional layer, its thickness and the method of applying same used here, the same possibilities and restrictions exist as with the previously described variants A, B and C (method step a (producing the first metal layer or metal foil) and method step c (forming the functional layer)).

Then a relatively thick covering layer, for example a positive photoresist film 2 (or a screen-printing lacquer, metal resist layer or perforated fail) is applied to the functional layer 3. The thickness of this covering layer has to be so large that metal webs formed in depressions in this layer can be formed for the walls of the flow channels, without these being able to grow beyond the covering layer. For example, the photoresist layer can be 30 $\mu$m thick. Thereafter, the positive photoresist layer is exposed with the pattern of the flow channels, those parts being exposed which do not correspond to the flow channels. In the subsequent development of the exposed photoresist layer, the regions of the photoresist layer which have been exposed and correspond to the flow channels are removed (method step b).

Thereafter at least a portion of the functional layer 3 on the exposed locations, as well as possibly a portion of the metal layer or foil 1 lying below same, is removed with an etching agent, such that a relatively deep channel is formed in the covering layer, the functional layer and possibly the metal layer or foil (method step b').

In method step b", a further metal layer 7 is deposited by a galvano-technical metallisation method, electrolytically or in an electroless manner, in the depressions produced. The webs thereby formed serve to produce the walls of the flow channels. To this end, the same metal can be deposited as the one of which the first metal layer or metal foil 1 consists, for example copper.

Then the surface can be made planar by the projecting photoresist layer 2 being removed, for example by grinding or polishing, partially up to the level of the webs 7 (method step f). In the following method step f', the photoresist layer 2 is removed by one of the previously described methods being used. The individual layer produced on the conclusion of this method sequence, contains flow channels which contain the functional layer 3 in the base region. The lateral walls of the flow channels are formed by the webs 7.

Finally a plurality of individual layers and a terminating segment are stacked up and joined to one another, in this case, too, the previously described methods being used.

In this case, too, there is the possibility of removing the photoresist layer 2 only after stacking up and joining the individual layers and the terminating segment.

This variant offers the advantage that the webs 7 can consist of a metal which either has a lower melting point than the first metal layer or foil 1 or which forms a low-melting inter-metallic phase with the functional layer 3, for example a eutectic. By this means, the individual layers and the terminating segment can in turn be joined to one another at a correspondingly lower temperature, such that the functional layer cannot diffuse into the material of the channel walls.

What is claimed is:

1. Method of manufacturing micro-components having at least one individual layer which has inner structures delimited by walls in the components and functional layers on the walls of the structures, with the following method steps:
   A. producing the at least one individual layer by
      a. producing a first metal layer or a metal foil;
      b. forming the inner structures in and/or on the first metal layer or metal foil by suitable etching methods and/or metal deposition methods; and
   B. stacking and joining the one individual layer to a segment terminating the inner structures, or a plurality of individual layers to one another and to the terminating segment, characterized by the additional method step c. forming the functional layers before method step B is carried out, solely on the walls of the inner structures.

2. Method according to claim 1, characterized in that the inner structures are formed in and/or on the first metal layer or metal foil by the following method steps:
   b. copying the inner structures on the first metal layer or metal foil by a structuring method; and
   b'. selective etching of the regions of the first metal layer or metal foil which are exposed during structuring.

3. Method according to claim 2, characterized in that the structuring method as per method step A.b comprises the following method alternatives:
   b1. coating at least one surface of the first metal layer or metal foil with a photosensitive layer, exposing the photosensitive layer with a pattern of the structures and exposing the first metal layer or metal foil at all the locations which correspond to the structures to be formed or
   b2. coating at least one surface of the first metal layer or metal foil with a screen-printing lacquer layer at the locations on the surface which do not correspond to the structures to be formed; or
   b3. laminating a perforated foil onto at least one surface of the first metal layer or metal foil, the perforations being provided at all the locations of the surface which correspond to the structures to be formed.

4. Method according to claim 3, characterized in that the photosensitive layer, the screen-printing lacquer layer or the perforated foil is removed again between method steps c and B or after method step B.

5. Method according to claim 3, characterized in that additional metal layers are applied, before method step B is carried out, solely on the surface regions of the first metal layer or metal foil which are not coated with the functional layers by:
   d. coating solely the functional layers by a protective film;
   e. forming additional metal layers after removing the photosensitive layer, the screen-printing lacquer layer or the perforated foil on the bare surface regions of the first metal layer or metal foil; and
   f. removing the protective film.

6. Method according to claim 3, characterized in that, before method step B is carried out, adhesive layers are applied exclusively to the surface regions of the first metal layer or metal foil which are not coated with the functional layers, by:
   d. covering solely the functional layers by a protective film;
   e. forming the adhesive layers after removing the photosensitive layer, the screen-printing lacquer layer or the perforated layer on the exposed surface regions of the first metal layer or metal foil; and
   f removing the protective film.

7. Method according to claim 1, characterized in that the inner structures are formed in the first metal layer or metal foil by the following method steps:
   c. forming a functional layer on the first metal layer or metal foil;
   b. copying the inner structures by one of the following method alternatives:
      b1. coating at least one surface of the functional layer with a photosensitive layer, exposing the photosensitive layer with a pattern of the structures and exposing the first metal layer or metal foil at all the locations which do not correspond to the structures to be formed; or
      b2. coating at least one surface of the functional layer with a screen-printing lacquer layer at the locations on the surface which correspond to the structures to be formed; or
      b3. laminating a perforated foil onto at least one surface of the functional layer, the perforations being provided at all the locations of the surface which do not correspond to the structures to be formed; and
   b' forming depressions in the functional layer by selective etching of the exposed regions of the functional layer;
   b" forming metal exclusively in the depressions formed in method step b'.

8. Method according to claim 7, characterized in that by grinding and/or polishing, a substantially flat surface is produced by the metal webs and the photosensitive layer, the screen-printing lacquer layer or the perforated foil.

9. Method according to claim 7, characterized in that the photosensitive layer, the screen-printing lacquer layer or the perforated foil is removed again before method step B is carried out.

10. Method according to claim 1, characterized in that the individual layer is connected to the terminating segment by a soldering welding or gluing method.

11. Method according to claim 1, characterized in that the first metal layer or metal foil is formed from copper, steel or aluminum.

12. Method according to claim 1, characterized in that the functional layers are formed from metals or alloys of metals of sub-group VIII of the periodic system of the elements, preferably from a metal, selected from the group consisting of platinum, iridium, palladium and gold.

13. Method according to claim 7, characterized in that the individual layer is connected to the terminating segment, or a plurality of individual layers are connected to one another and to the terminating segment by a soldering, welding or gluing method.

14. Method according to claim 7, characterized in that the first metal layer or metal foil is formed from copper, steel or aluminum.

15. Method according to claim 7, characterized in that the functional layers are formed from metals or alloys of metals of sub-group VIII of the periodic system of the elements, preferably from a metal, selected from the group consisting of platinum, iridium, palladium and gold.

* * * * *